United States Patent
Sai

(10) Patent No.: US 10,523,173 B2
(45) Date of Patent: Dec. 31, 2019

(54) QUARTZ CRYSTAL RESONATOR AND METHOD FOR MANUFACTURING THE SAME, AND QUARTZ CRYSTAL RESONATOR UNIT AND METHOD FOR MANUFACTURING THE SAME

(71) Applicant: Murata Manufacturing Co., Ltd., Nagaokakyo-shi, Kyoto-fu (JP)

(72) Inventor: Koki Sai, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 334 days.

(21) Appl. No.: 15/673,940

(22) Filed: Aug. 10, 2017

(65) Prior Publication Data

US 2018/0069521 A1    Mar. 8, 2018

(30) Foreign Application Priority Data

Sep. 8, 2016 (JP) .................... 2016-175231

(51) Int. Cl.
*H01L 41/047* (2006.01)
*H01L 41/053* (2006.01)
*H01L 41/09* (2006.01)
*H03H 3/00* (2006.01)
*H03H 9/19* (2006.01)
*H03H 3/013* (2006.01)

(52) U.S. Cl.
CPC .............. *H03H 3/013* (2013.01); *H03H 9/19* (2013.01)

(58) Field of Classification Search
CPC .................. H03H 3/013; H03H 9/19
USPC ................... 310/363–365, 367, 368
See application file for complete search history.

(56) References Cited

U.S. PATENT DOCUMENTS

| 8,742,651 B2 | 6/2014 | Mizusawa |
| 2002/0014808 A1* | 2/2002 | Misu .............. H03H 9/02133 310/312 |
| 2012/0280598 A1 | 11/2012 | Mizusawa |
| 2018/0115301 A1* | 4/2018 | Kaga ................ H01L 41/047 |
| 2018/0167051 A1* | 6/2018 | Kaga ................ H03H 3/04 |
| 2018/0205364 A1* | 7/2018 | Kaga ............... H03H 9/02062 |

FOREIGN PATENT DOCUMENTS

| JP | 2002246866 A | 8/2002 |
| JP | 2013034217 A | 2/2013 |
| TW | 201246638 A | 11/2012 |

* cited by examiner

*Primary Examiner* — Thomas M Dougherty
(74) *Attorney, Agent, or Firm* — Arent Fox LLP

(57) ABSTRACT

A method for manufacturing a quartz crystal resonator that includes a quartz crystal blank having a vibrating portion including a center of a principal surface of the quartz crystal blank when viewed in plan from a direction normal to the principal surface and a peripheral portion adjacent to the vibrating portion, a pair of excitation electrodes disposed opposite to each other with the vibrating portion interposed therebetween, a pair of electrode pads disposed on the peripheral portion, and a pair of extended electrodes each extending from the vibrating portion to the peripheral portion to electrically connect one excitation electrode to a corresponding electrode pad, where the method includes conducting a first trimming of the vibrating portion and the peripheral portion; and conducting a second trimming of part of one of the excitation electrodes on the vibrating portion.

4 Claims, 5 Drawing Sheets

QUARTZ CRYSTAL RESONATOR AND METHOD FOR MANUFACTURING THE SAME, AND QUARTZ CRYSTAL RESONATOR UNIT AND METHOD FOR MANUFACTURING THE SAME

CROSS REFERENCE TO RELATED APPLICATIONS

The present application claims priority to Japanese Patent Application No. 2016-175231, filed Sep. 8, 2016, the entire contents of which are incorporated herein by reference.

BACKGROUND OF THE INVENTION

Field of the Invention

The present invention relates to a quartz crystal resonator and a method for manufacturing the same, and also relates to a quartz crystal resonator unit and a method for manufacturing the same.

Description of the Related Art

Quartz crystal resonator units are widely used as sources of reference signals, for example, in oscillation devices and bandpass filters. For such a quartz crystal resonator unit to achieve desired frequency characteristics, an excitation electrode of a quartz crystal resonator mounted on a base member is trimmed to adjust the frequency of the quartz crystal resonator. For example, Japanese Unexamined Patent Application Publication No. 2002-246866 discloses a method in which, in a quartz crystal resonator unit having a recessed portion, a surface on a flat side of the quartz crystal resonator unit is substantially entirely dry-etched to uniformly process an entire electrode. Also, as a solution to disconnection problems associated with the method disclosed in Japanese Unexamined Patent Application Publication No. 2002-246866, Japanese Unexamined Patent Application Publication No. 2013-34217 discloses a method for manufacturing a quartz crystal resonator which includes a vibrating portion having an excitation electrode thereon, a peripheral portion having an electrode pad thereon and differing in height from a surface of the vibrating portion, and an extended electrode extending over the vibrating portion and the peripheral portion. The method includes an etching step which removes only part of the excitation electrode to adjust the excitation frequency.

In the method disclosed in Japanese Unexamined Patent Application Publication No. 2002-246866, an extended electrode is trimmed and this may lead to disconnection in the extended electrode when, for example, the extended electrode is configured to pass through a stepped portion. The method disclosed in Japanese Unexamined Patent Application Publication No. 2013-34217 may reduce disconnection caused by a reduced thickness of the extended electrode on a stepped portion between the vibrating portion and the peripheral portion. However, when very fine particles adhering to the quartz crystal resonator depart therefrom and then move therearound or adhere thereto again, the frequency of the quartz crystal resonator may be varied.

SUMMARY OF THE INVENTION

The present invention has been made in view of the circumstances described above. An object of the present invention is to provide a quartz crystal resonator and a method for manufacturing the same and a quartz crystal resonator unit and a method for manufacturing the same that improve electrical reliability and stabilize frequency characteristics.

A method for manufacturing a quartz crystal resonator according to preferred embodiments of the present invention includes first preparing or providing a quartz crystal resonator that includes a quartz crystal blank having a vibrating portion including a center of a principal surface of the quartz crystal blank when viewed in plan from a direction normal to the principal surface and a peripheral portion adjacent to the vibrating portion, a pair of excitation electrodes disposed opposite to each other with the vibrating portion interposed therebetween, a pair of electrode pads disposed on the peripheral portion, and a pair of extended electrodes each extending from the vibrating portion to the peripheral portion to electrically connect one of the excitation electrodes to a corresponding one of the electrode pads; conducting a first trimming of the vibrating portion and the peripheral portion; and conducting a second trimming of part of one of the excitation electrodes on the vibrating portion.

This method performs the first trimming on the vibrating portion and the peripheral portion, and performs the second trimming on part of one of the excitation electrodes on the vibrating portion. The first trimming can clean the quartz crystal resonator while minimizing unnecessary removal of the extended electrodes and the like, and the second trimming can make as much frequency adjustment as needed through partial removal of the excitation electrode. It is thus possible to clean the quartz crystal resonator by removing foreign matter therefrom, reduce the amount of variation in excitation frequency caused by adhesion or separation of foreign matter, and prevent or reduce the occurrence of disconnection by reducing the amount of removal processing on the extended electrodes.

A quartz crystal resonator according to preferred embodiments of the present invention includes a quartz crystal blank having a vibrating portion including a center of a principal surface of the quartz crystal blank when viewed in plan from a direction normal to the principal surface and a peripheral portion adjacent to the vibrating portion; a pair of excitation electrodes disposed opposite each other with the vibrating portion interposed therebetween; a pair of electrode pads disposed on the peripheral portion; and a pair of extended electrodes each extending from the vibrating portion to the peripheral portion to electrically connect one of the excitation electrodes to a corresponding one of the electrode pads. The pair of excitation electrodes includes a first excitation electrode and a second excitation electrode. The first excitation electrode includes a first region having a thickness $T1$ and a second region having a thickness $T2$ larger than the thickness $T1$, and the second excitation electrode includes a third region having a thickness $T3$ larger than the thickness $T2$.

This configuration improves electrical reliability and stabilizes frequency characteristics.

The present invention provides a quartz crystal resonator and a method for manufacturing the same and a quartz crystal resonator unit and a method for manufacturing the same that improve electrical reliability and stabilize frequency characteristics.

Other features, elements, characteristics and advantages of the present invention will become more apparent from the following detailed description of preferred embodiments of the present invention with reference to the attached drawings.

DESCRIPTION OF THE PREFERRED EMBODIMENTS

Figure 1:
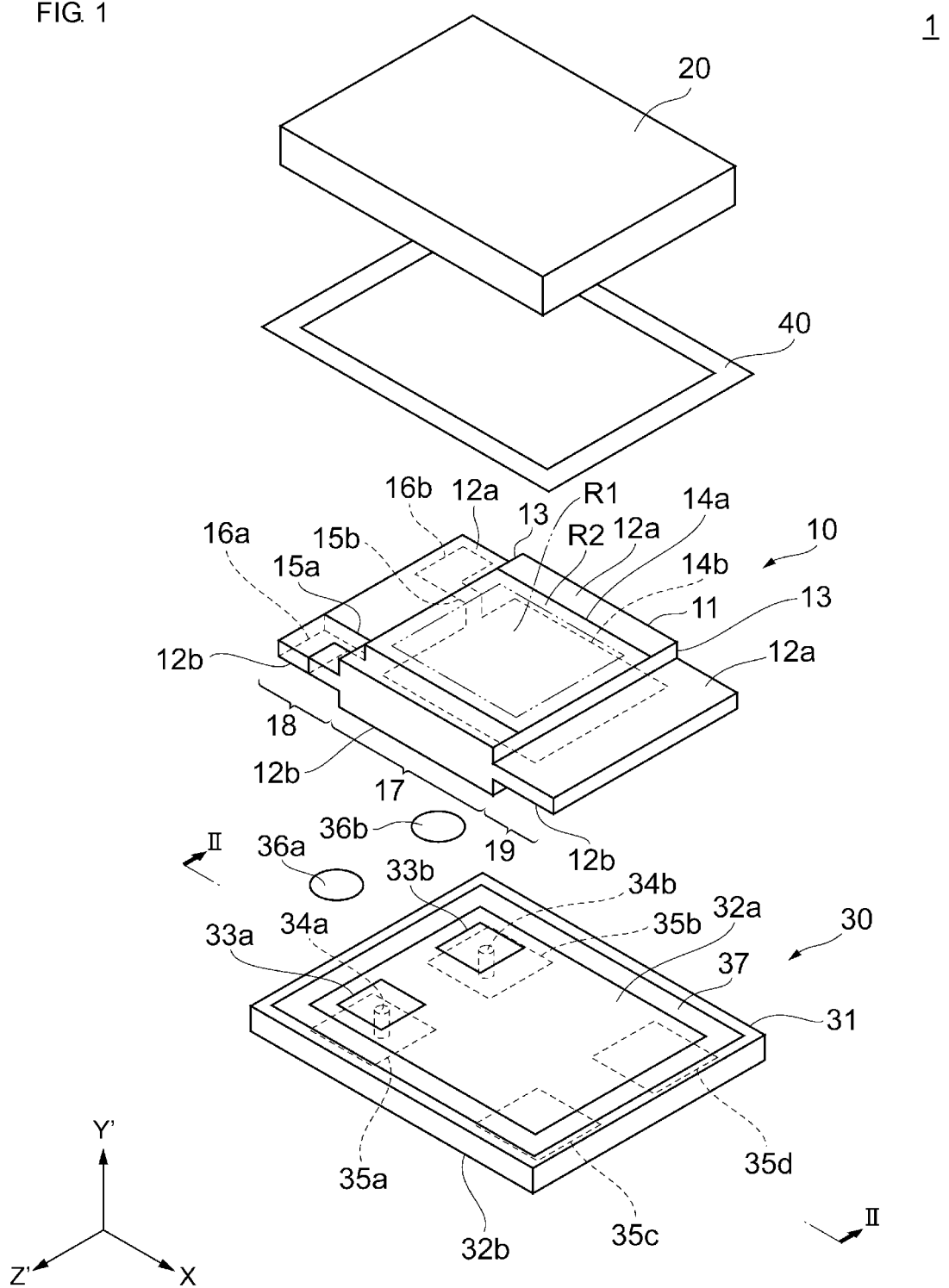
FIG. 1 is an exploded perspective view of a quartz crystal resonator unit according to a first embodiment of the present invention.

Embodiments of the present invention will now be described. Throughout the drawings, the same or similar components are denoted by the same or similar reference numerals. Note that the drawings are given for illustrative purposes, and dimensions and shapes of parts are schematically shown. The technical scope of the invention of the present application is not to be interpreted as being limited to the embodiments described below.

First Embodiment

Figure 2:
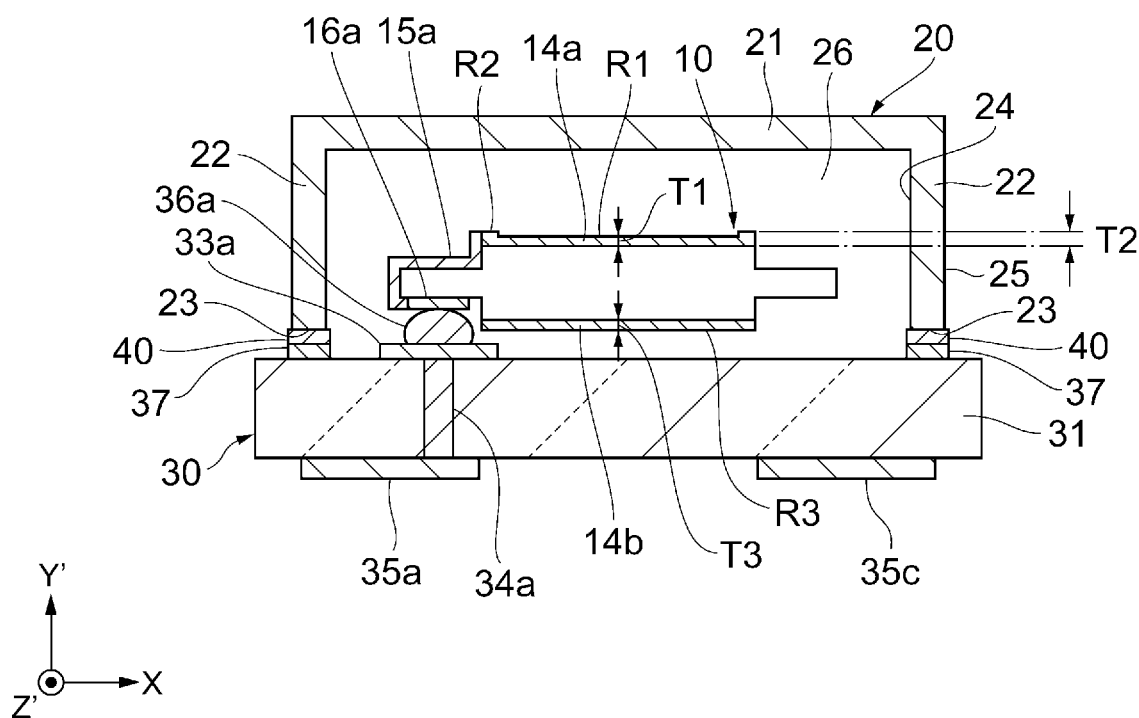
FIG. 2 is a cross-sectional view taken along line II-II of FIG. 1.

A quartz crystal resonator unit according to a first embodiment of the present invention will now be described with reference to FIGS. 1 and 2. FIG. 1 is an exploded perspective view of a quartz crystal resonator unit according to the first embodiment of the present invention. FIG. 2 is a cross-sectional view taken along line II-II of FIG. 1.

As illustrated in FIG. 1, a quartz crystal resonator unit 1 according to the present embodiment includes a quartz crystal resonator 10, a lid member 20, and a base member 30. The lid member 20 and the base member 30 are retainers for accommodating the quartz crystal resonator 10. In the example illustrated in FIG. 1, the lid member 20 has a substantially tray-like shape (or has a substantially inverted U-shaped cross section), whereas the base member 30 has a substantially flat plate-like shape.

The quartz crystal resonator 10 includes an AT-cut quartz crystal blank 11. The X-axis, the Y-axis, and the Z-axis are crystal axes of a synthetic quartz crystal. Axes obtained by rotating the Y-axis and the Z-axis by about 35° 15'±1'30" around the X-axis in the direction from the Y-axis to the Z-axis are defined as the Y'-axis and the Z'-axis, respectively. The AT-cut quartz crystal blank 11 is cut out such that its principal surfaces lie in planes parallel to the plane defined by the X-axis and the Z'-axis. Hereinafter, a plane parallel to the plane defined by the X-axis and the Z'-axis will be referred to as "XZ'-plane". The same applies to planes defined by other axes. The quartz crystal blank 11 has a first principal surface 12a and a second principal surface 12b that lie in XZ'-planes opposite each other.

The quartz crystal blank 11, which is an AT-cut quartz crystal blank, has a long-side direction in which long sides thereof parallel to the X-axis direction extend, a short-side direction in which short sides thereof parallel to the Z'-axis direction extend, and a thickness direction in which a thickness thereof parallel to the Y'-axis direction extends. The quartz crystal blank 11 is substantially rectangular when viewed from a direction normal to an XZ'-plane.

Quartz crystal resonators using an AT-cut quartz crystal blank (i.e., AT-cut quartz crystal resonators) have very high frequency stability over a wide range of temperatures, have good aging characteristics, and can be manufactured at low cost. The AT-cut quartz crystal resonators have a thickness shear mode as a principal mode of vibration.

The quartz crystal blank 11 has a vibrating portion 17 including the center of the principal surfaces 12a and 12b when viewed in plan from a direction normal to the first principal surface 12a, and peripheral portions 18 and 19 adjacent to the vibrating portion 17. The vibrating portion 17 has long sides parallel to the X-axis direction and short sides parallel to the Z'-axis direction when viewed in plan from the direction normal to the first principal surface 12a. The peripheral portions 18 and 19 are disposed on both sides of the vibrating portion 17 in the long-side direction of the quartz crystal blank 11. The peripheral portions 18 and 19 correspond to a peripheral portion of a quartz crystal blank according to the present embodiment.

In the present embodiment, the quartz crystal resonator 10 has a mesa structure. Specifically, the vibrating portion 17 differs in thickness from the peripheral portions 18 and 19. In the example illustrated in FIG. 1, the thickness of the vibrating portion 17 in the Y'-axis direction is larger than the thickness of the peripheral portions 18 and 19 in the Y'-axis direction. In the long-side direction of the quartz crystal blank 11, the quartz crystal blank 11 has a stepped portion 13 at the boundary between the vibrating portion 17 and the peripheral portion 18 and also at the boundary between the vibrating portion 17 and the peripheral portion 19. The stepped portions 13 extend along the short-side direction of the quartz crystal blank 11. The stepped portions 13 are formed at a predetermined angle of inclination dependent on the quartz crystal orientation. The peripheral portions 18 and 19 have the same thickness in the Y'-axis direction.

The quartz crystal resonator 10 includes a first excitation electrode 14a and a second excitation electrode 14b forming a pair of electrodes. The first excitation electrode 14a is disposed on the first principal surface 12a of the vibrating portion 17, and the second excitation electrode 14b is disposed on the second principal surface 12b of the vibrating portion 17. That is, the first excitation electrode 14a and the second excitation electrode 14b are disposed opposite each other, with the vibrating portion 17 interposed therebetween. The first excitation electrode 14a and the second excitation electrode 14b are disposed to substantially entirely overlap when viewed from a direction normal to an XZ'-plane.

The first excitation electrode 14a and the second excitation electrode 14b each have long sides parallel to the X-axis direction, short sides parallel to the Z'-axis direction, and a thickness parallel to the Y'-axis direction. In the example illustrated in FIG. 1, when viewed from a direction normal to an XZ'-plane, the long sides of the first and second excitation electrodes 14a and 14b are parallel to the long sides of the quartz crystal blank 11 (or to the long sides of the vibrating portion 17), and the short sides of the first and second excitation electrodes 14a and 14b are parallel to the short sides of the quartz crystal blank 11 (or to the short sides of the vibrating portion 17). The long sides of the first and second excitation electrodes 14a and 14b are spaced from the corresponding long sides of the vibrating portion 17, whereas the short sides of the first and second excitation electrodes 14a and 14b coincide with the corresponding short sides of the vibrating portion 17.

In the example illustrated in FIGS. 1 and 2, the first excitation electrode 14a facing opposite the base member 30 include a region R1 having a thickness T1 and a region R2 having a thickness T2. For example, the region R1 is an inner region surrounded by the region R2. The second excitation electrode 14b facing toward the base member 30 includes a region R3 having a thickness T3. In the present embodiment, these thicknesses T1, T2, and T3 of the regions R1, R2, and R3 of the first and second excitation electrodes 14a and 14b satisfy the relationship T1<T2<T3. The thicknesses T1, T2, and T3 and the regions R1, R2, and R3 of the first and second excitation electrodes 14a and 14b will be described in detail later on in the description of a manufacturing method.

The quartz crystal resonator 10 includes extended electrodes 15a and 15b and electrode pads 16a and 16b. The electrode pad 16a is electrically connected by the extended electrode 15a to the first excitation electrode 14a. The electrode pad 16b is electrically connected by the extended electrode 15b to the second excitation electrode 14b. The electrode pads 16a and 16b are terminals for electrical connection to the base member 30. In the peripheral portion 18 of the quartz crystal blank 11, the electrode pads 16a and 16b are arranged on the second principal surface 12b along the short-side direction.

The extended electrode 15a electrically connects the first excitation electrode 14a to the electrode pad 16a. Specifically, on the first principal surface 12a, the extended electrode 15a extends from the first excitation electrode 14a on the vibrating portion 17 through the stepped portion 13 to the peripheral portion 18, and further extends from the first principal surface 12a of the peripheral portion 18 through a side face of the quartz crystal blank 11 to the second principal surface 12b, on which the extended electrode 15a is electrically connected to the electrode pad 16a on the peripheral portion 18. The extended electrode 15b electrically connects the second excitation electrode 14b to the electrode pad 16b. Specifically, on the second principal surface 12b, the extended electrode 15b extends from the second excitation electrode 14b on the vibrating portion 17 through the stepped portion 13 to the peripheral portion 18, and is electrically connected to the electrode pad 16b on the peripheral portion 18. By extending the extended electrodes 15a and 15b as described above, the electrode pads 16a and 16b electrically connected to the first and second excitation electrodes 14a and 14b on the first and second principal surfaces 12a and 12b, respectively, are both arranged on the second principal surface 12b.

The electrode pads 16a and 16b are electrically connected by conductive retaining members 36a and 36b, respectively, to corresponding electrodes of the base member 30. The conductive retaining members 36a and 36b are formed by thermally curing a conductive adhesive.

Materials of the first and second excitation electrodes 14a and 14b, the extended electrodes 15a and 15b, and the electrode pads 16a and 16b are not particularly limited. For example, these electrodes may each have a chromium (Cr) layer as a base layer, and also have a gold (Au) layer on the surface of the chromium layer.

The lid member 20 is joined to the base member 30, and the quartz crystal resonator 10 is thus accommodated in an internal space 26. The lid member 20 has an inner surface 24 and an outer surface 25. The lid member 20 has a substantially inverted U-shaped cross section that opens toward a first principal surface 32a of the base member 30.

The lid member 20 has a bottom portion 21 facing the first principal surface 32a of the base member 30, and a side wall portion 22 connected to the outer edge of the bottom portion 21 and extending in the direction normal to the principal surfaces of the bottom portion 21. The lid member 20 is substantially rectangular when viewed in plan from the direction normal to the principal surfaces of the bottom portion 21. The lid member 20 has, for example, a long-side direction in which long sides thereof parallel to the X-axis direction extend, a short-side direction in which short sides thereof parallel to the Z'-axis direction extend, and a height direction parallel to the Y'-axis direction. The lid member 20 has, at the opening edge thereof, a counter face 23 facing the first principal surface 32a of the base member 30. The counter face 23 extends substantially in the shape of a frame to surround the quartz crystal resonator 10.

The material of the lid member 20 is not particularly limited. For example, the lid member 20 may be made of a conductive material, such as metal. Since this allows the lid member 20 to be electrically connected to the ground potential, a shield function can be added to the lid member 20. For example, the lid member 20 may be made of an alloy (e.g., 42 alloy) containing iron (Fe) and nickel (Ni). The outermost surface of the lid member 20 may be coated with a gold (Au) layer for protection from oxidation. The lid member 20 may be made of an insulating material, or may have a composite structure of conductive and insulating materials.

The base member 30 supports the quartz crystal resonator 10 such that the quartz crystal resonator 10 can be excited. Specifically, the quartz crystal resonator 10 is retained on the first principal surface 32a of the base member 30, with the conductive retaining members 36a and 36b interposed therebetween, such that the quartz crystal resonator 10 can be excited.

The base member 30 has a substantially flat plate-like shape. The base member 30 has a long-side direction in which long sides thereof parallel to the X-axis direction extend, a short-side direction in which short sides thereof parallel to the Z'-axis direction extend, and a thickness direction in which a thickness thereof parallel to the Y'-axis direction extends.

The base member 30 has a base portion 31. The base portion 31 has the first principal surface 32a and a second principal surface 32b that lie in XZ'-planes facing each other. For example, the base portion 31 is a sintered body of insulating ceramic (alumina). In this case, a plurality of insulating ceramic sheets may be stacked and sintered. Alternatively, the base portion 31 may be made of a glass material (e.g., silicate glass, or material primarily composed of materials other than silicate and exhibiting a glass transition phenomenon when temperature rises), a quartz crystal material (e.g., AT-cut quartz crystal), or glass epoxy resin. The base portion 31 is preferably made of a heat-resistant material. The base portion 31 may be formed by a single layer or multiple layers. When the base portion 31 is formed by multiple layers, the base portion 31 includes an insulating layer formed on the first principal surface 32a.

The base member 30 has connection electrodes 33a and 33b on the first principal surface 32a, and outer electrodes 35a, 35b, 35c, and 35d on the second principal surface 32b. The connection electrodes 33a and 33b are terminals for electrical connection to the quartz crystal resonator 10. The outer electrodes 35a, 35b, 35c, and 35d are terminals for electrical connection to a mounting board (not shown). The connection electrode 33a is electrically connected to the outer electrode 35a by a via electrode 34a extending in the Y'-axis direction, and the connection electrode 33b is electrically connected to the outer electrode 35b by a via electrode 34b extending in the Y'-axis direction. The via electrodes 34a and 34b are formed in respective via holes passing through the base portion 31 in the Y'-axis direction.

The connection electrodes 33a and 33b of the base member 30 are disposed on the first principal surface 32a near a short side of the base member 30 on the negative side of the X-axis. The connection electrodes 33a and 33b are arranged, at a distance from the short side of the base member 30, along the short-side direction. The connection electrode 33a is connected to the electrode pad 16a of the quartz crystal resonator 10 with the conductive retaining member 36a interposed therebetween, and the connection electrode 33b is connected to the electrode pad 16b of the quartz crystal resonator 10 with the conductive retaining member 36b interposed therebetween.

The outer electrodes 35a, 35b, 35c, and 35d are disposed near the respective corners of the second principal surface 32b. In the example illustrated in FIG. 1, the outer electrodes 35a and 35b are disposed directly below the connection electrodes 33a and 33b, respectively. This allows the via electrodes 34a and 34b extending in the Y'-axis direction to electrically connect the outer electrodes 35a and 35b to the connection electrodes 33a and 33b, respectively. Of the four outer electrodes 35a, 35b, 35c, and 35d, in the example illustrated in FIG. 1, the outer electrodes 35a and 35b disposed near the short side of the base member 30 on the negative side of the X-axis are input and output electrodes to which input and output signals of the quartz crystal resonator 10 are supplied. The outer electrodes 35c and 35d disposed near the short side of the base member 30 on the positive side of the X-axis are dummy electrodes to which input and output signals of the quartz crystal resonator 10 are not supplied. Input and output signals of other electronic elements on the mounting board (not shown) on which the quartz crystal resonator unit 1 is mounted are also not supplied to the dummy electrodes. Alternatively, the outer electrodes 35c and 35d may be ground electrodes to which a ground potential is supplied. When the lid member 20 is made of a conductive material, a shield function can be added to the lid member 20 by connecting the lid member 20 to the outer electrodes 35c and 35d serving as ground electrodes.

A sealing frame 37 is disposed on the first principal surface 32a of the base portion 31. The sealing frame 37 has a substantially rectangular frame-like shape when viewed in plan from the direction normal to the first principal surface 32a. The connection electrodes 33a and 33b are disposed inside the sealing frame 37. The sealing frame 37 is made of a conductive material. A joining member 40 (described below) is disposed on the sealing frame 37. The lid member 20 is joined to the base member 30, with the joining member 40 and the sealing frame 37 interposed therebetween.

The connection electrodes 33a and 33b and the outer electrodes 35a to 35d of the base member 30, and the sealing frame 37 are formed of metal films. For example, the connection electrodes 33a and 33b and the outer electrodes 35a to 35d are formed by stacking a molybdenum (Mo) layer, a nickel (Ni) layer, and a gold (Au) layer in this order from the bottom to the top. The sealing frame 37 may be formed by a molybdenum (Mo) layer, or by stacking a molybdenum (Mo) layer, a nickel (Ni) layer, and a gold (Au) layer in the same manner as the connection electrodes 33a and 33b and the outer electrodes 35a to 35d. The via electrodes 34a and 34b can be formed by filling the via holes in the base portion 31 with a metal material, such as molybdenum.

The arrangement of the connection electrodes 33a and 33b is not limited to that described above. For example, the connection electrodes 33a and 33b may be disposed near the opposite short sides of the base member 30. In this configuration, the quartz crystal resonator 10 is retained by the base member 30 at both end portions of the quartz crystal blank 11 in the long-side direction.

The arrangement of the outer electrodes 35a to 35d is not limited to that described above. For example, two outer electrodes serving as input and output electrodes may be diagonally arranged on the second principal surface 32b. Four outer electrodes may be disposed near the centers of the respective sides of the second principal surface 32b, rather than being disposed at the respective corners of the second principal surface 32b. The number of outer electrodes is not limited to four. For example, there may be only two outer electrodes which serve as input and output electrodes. Also, the electrical connection between the connection electrodes and the outer electrodes is not limited to that made by the via electrodes. The electrical conduction may be achieved by extending extended electrodes on the first principal surface 32a or the second principal surface 32b. Alternatively, the electrical connection between the connection electrodes and the outer electrodes may be made by forming the base portion 31 of the base member 30 in multiple layers, extending the via electrodes to an intermediate layer, and extending extended electrodes on the intermediate layer.

As illustrated in FIG. 2, by joining the lid member 20 and the base member 30 together, with the sealing frame 37 and the joining member 40 interposed therebetween, the quartz crystal resonator 10 is sealed in the internal space (cavity) 26 surrounded by the lid member 20 and the base member 30. In this case, the internal space 26 is preferably in a vacuum where the pressure is lower than atmospheric pressure. This is preferable in that, for example, aging of the first and second excitation electrodes 14a and 14b caused by oxidation can be reduced.

The joining member 40 is disposed along the entire circumferences of the lid member 20 and the base member 30. Specifically, the joining member 40 is disposed on the sealing frame 37. The sealing frame 37 and the joining member 40 are interposed between the counter face 23 of the side wall portion 22 of the lid member 20 and the first principal surface 32a of the base member 30, whereby the quartz crystal resonator 10 is sealed by the lid member 20 and the base member 30.

The joining member 40 is, for example, a brazing member. Specifically, the joining member 40 is made of a gold-tin (Au—Sn) eutectic alloy. The lid member 20 and the base member 30 are thus joined by metal joining, which can improve sealing performance. The joining member 40 does not necessarily need to be made of a conductive material. The joining member 40 may be made of an adhesive material for bonding of glass, such as low-melting glass (e.g., lead-borate glass or tin-phosphate glass), or an insulating material, such as a resin adhesive. This is less costly than metal joining, lowers the heating temperature, and simplifies the manufacturing process.

In the quartz crystal resonator 10 according to the present embodiment, one end of the quartz crystal blank 11 in the long-side direction (i.e., an end portion of the quartz crystal blank 11 adjacent to the conductive retaining members 36a and 36b) is a fixed end, whereas the other end of the quartz crystal blank 11 is a free end. The quartz crystal resonator 10, the lid member 20, and the base member 30 are substantially rectangular when viewed from a direction normal to an XZ'-plane, and have the same long-side direction and the same short-side direction.

The position of the fixed end of the quartz crystal resonator 10 is not particularly limited. A modification may be made such that the quartz crystal resonator 10 is secured to the base member 30 at both ends of the quartz crystal blank 11 in the long-side direction. In this case, the electrodes on both the quartz crystal resonator 10 and the base member 30 may be formed such that the quartz crystal resonator 10 is secured at both ends of the quartz crystal blank 11 in the long-side direction.

In the quartz crystal resonator unit 1 according to the present embodiment, an alternating electric field is applied between the first and second excitation electrodes 14a and 14b forming a pair in the quartz crystal resonator 10, through the outer electrodes 35a and 35b of the base member 30. This causes the vibrating portion 17 of the quartz crystal blank 11 to vibrate in a predetermined vibration mode, such as a thickness shear mode, and provides resonance characteristics determined by the vibration.

Figure 3:
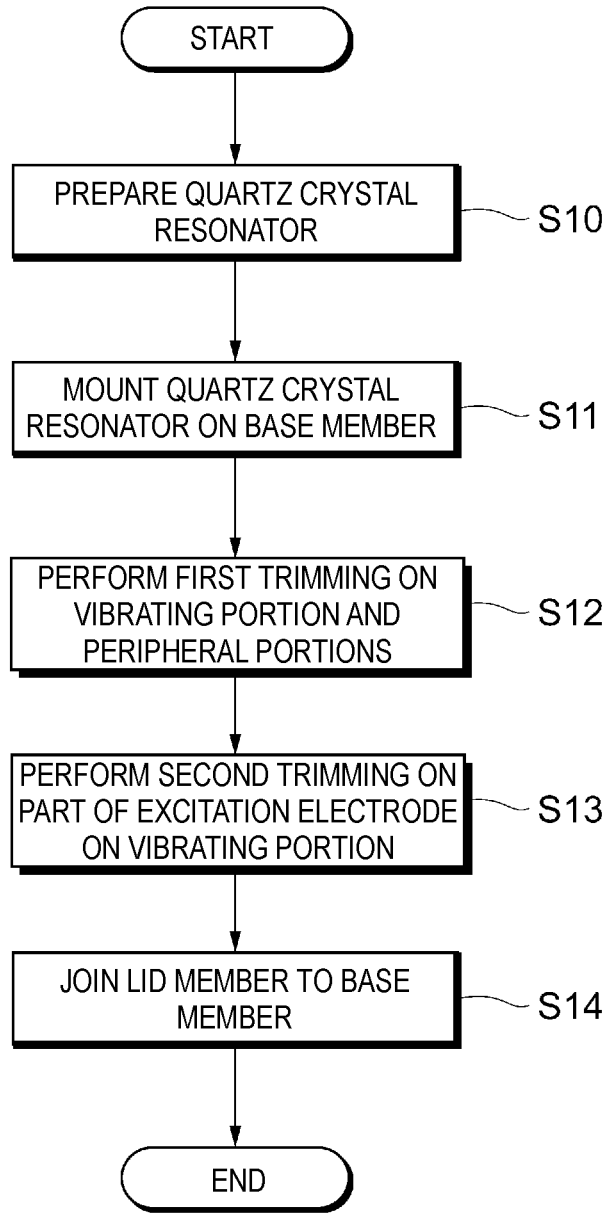
FIG. 3 is a flowchart illustrating a method for manufacturing the quartz crystal resonator unit according to the first embodiment of the present invention.

A method for manufacturing a quartz crystal resonator unit according to the first embodiment of the present invention will now be described with reference to FIGS. 3 to 5. As an example, the present embodiment describes a method for manufacturing the quartz crystal resonator unit 1. FIG. 3 is a flowchart illustrating the method, and FIGS. 4 and 5 each illustrate a trimming step.

The present embodiment performs a first trimming step (see FIG. 4) and a second trimming step (see FIG. 5) on a quartz crystal resonator 70 mounted on the base member 30, and thereby manufactures the quartz crystal resonator 10 including the first excitation electrode 14a (obtained by trimming to a predetermined thickness for frequency adjustment) and the second excitation electrode 14b. A detailed description will now be given.

First, the quartz crystal resonator 70 is prepared (S10). The step of processing a quartz crystal blank and the step of forming various electrodes will not be described, as they use commonly used techniques. The quartz crystal resonator 70 has the same configuration as the quartz crystal resonator 10 illustrated in FIG. 1, except that upper portions of a first excitation electrode 74a and an extended electrode 75a on the first principal surface 12a, in the thickness direction, are not removed. The first excitation electrode 74a has the thickness T3, which is the same as the thickness of the second excitation electrode 14b.

Next, the quartz crystal resonator 70 is mounted on the base member 30 (S11). Specifically, a conductive adhesive is applied onto the connection electrodes 33a and 33b on the first principal surface 32a of the base portion 31. Then the conductive adhesive is thermally cured, with the quartz crystal resonator 70 mounted on the base member 30. Thus, by the conductive retaining members 36a and 36b formed by thermally curing the conductive adhesive, the electrode pads 16a and 16b of the quartz crystal resonator 70 are electrically connected to the connection electrodes 33a and 33b, respectively, of the base member 30. The conductive retaining members 36a and 36b retain the quartz crystal resonator 70 such that the quartz crystal resonator 70 can be excited. The quartz crystal resonator 70 is mounted on the first principal surface 32a, with the second excitation electrode 14b facing toward the base member 30.

Figure 4:
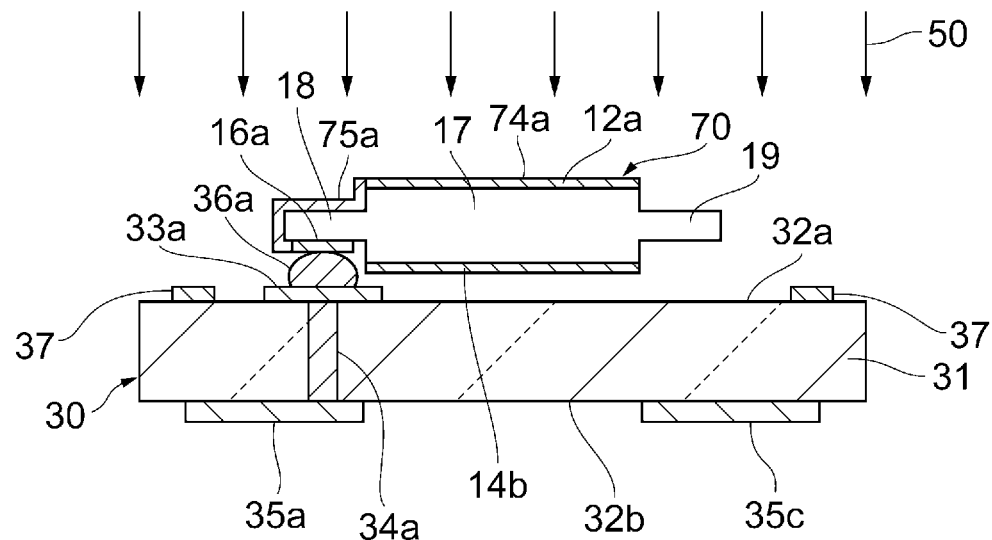
FIG. 4 illustrates a first trimming step in the method for manufacturing the quartz crystal resonator unit according to the first embodiment of the present invention.

Next, a first trimming step is performed on the vibrating portion 17 and the peripheral portions 18 and 19 of the quartz crystal resonator 70 (S12, see FIG. 4). The first trimming step is, for example, an ion milling step which involves applying ion beams 50 under reduced pressure. The ion beams 50 are applied from above the first principal surface 12a of the quartz crystal resonator 70. This removes at least foreign matter (particles), such as quartz crystal grains, processing residuals of electrodes or resin resists and dust particles in the atmosphere, adhering to the surface of the quartz crystal resonator 70.

In the example illustrated in FIG. 4, the first trimming step slightly removes the upper portion of at least one of the first principal surface 12a, the first excitation electrode 74a, and the extended electrode 75a of the quartz crystal resonator 70 in the thickness direction. In the example illustrated in FIG. 4, the first trimming step slightly removes the upper portions of the first excitation electrode 74a and the extended electrode 75a in the thickness direction to form a first excitation electrode 74a' (see FIG. 5) and the extended electrode 15a. As described below, the first trimming step performs a smaller amount of removal processing, or takes less processing time, than the second trimming step. This can prevent or reduce the occurrence of disconnection caused by trimming the extended electrode.

As described above, the first trimming step can remove at least foreign matter adhering to the first principal surface 12a of the quartz crystal resonator 70, and thus can clean the quartz crystal resonator 70. Applying the ion beams 50 under a reduced-pressure atmosphere causes ions to react with the foreign matter, thereby causing the foreign matter to be released into the reduced-pressure atmosphere. This can prevent the foreign matter from adhering to the quartz crystal resonator 70 again.

In the example illustrated in FIG. 4, the first trimming step is performed throughout the vibrating portion 17 and the peripheral portions 18 and 19 of the quartz crystal resonator 70. In this case, by performing the first trimming step also on the first principal surface 32a of the base portion 31 of the base member 30 as illustrated in FIG. 4, the base member 30 as well as the quartz crystal resonator 70 can be cleaned.

The area of the first trimming step may be any area that includes the area of the second trimming step (described below), and does not necessarily need to be throughout the vibrating portion 17 and the peripheral portions 18 and 19.

Figure 5:
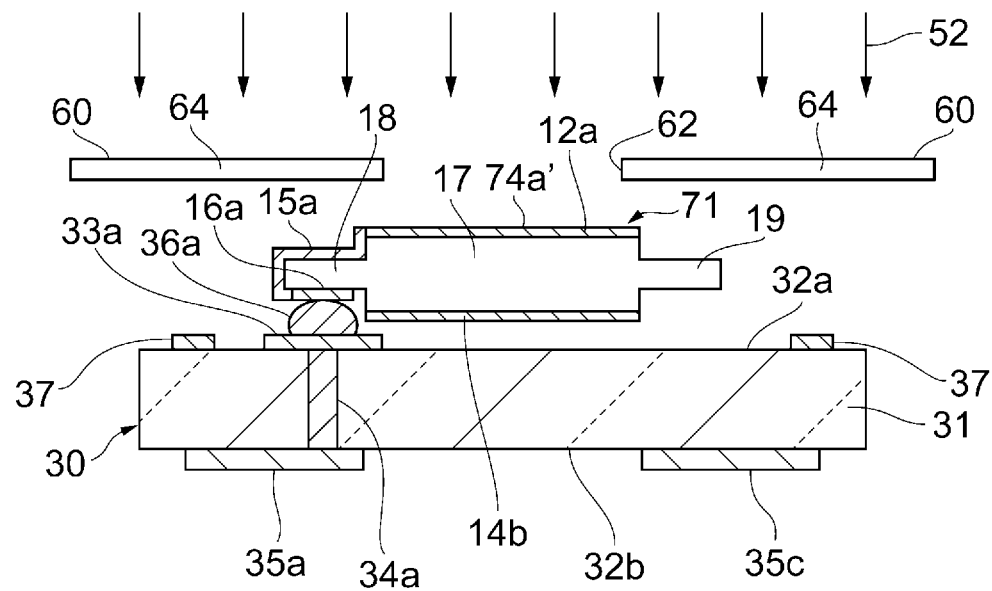
FIG. 5 illustrates a second trimming step in the method for manufacturing the quartz crystal resonator unit according to the first embodiment of the present invention.

In a quartz crystal resonator 71 obtained after the first trimming step, the second trimming step is performed on part of the first excitation electrode 74a' on the vibrating portion 17 (S13, see FIG. 5). The second trimming step is, for example, an ion milling step which involves applying ion beams 52 under reduced pressure.

In the example illustrated in FIG. 5, a mask 60 formed by a metal plate having an opening therein is placed above the quartz crystal resonator 71, and the ion beams 52 are applied from above through the mask 60. The mask 60 has an opening 62 that allows the ion beams 52 to pass therethrough toward part of a center portion of the first excitation electrode 74a', and a shield portion 64 that blocks the ion beams 52. Until a predetermined excitation frequency is reached, the upper surface of the center portion of the first excitation electrode 74a' is removed. After the second trimming step, the frequency of the quartz crystal resonator 71 is measured. The second trimming step may be performed while measuring the frequency of the quartz crystal resonator 71.

By performing the second trimming step after the first trimming step as described above, the frequency adjustment of the quartz crystal resonator can be made after removing foreign matter and cleaning the quartz crystal resonator. This ensures stable adjustment of the excitation frequency. The second trimming step may be performed multiple times, as necessary, until a desired excitation frequency is achieved.

The second trimming step performs a larger amount of removal processing, or takes more processing time, than the first trimming step. Therefore, the first trimming step can minimize unnecessary removal of the extended electrode 75a and the like and clean the quartz crystal resonator, while the second trimming step can perform necessary removal of the excitation electrode for frequency adjustment.

The second trimming step is preferably performed on an area that does not include the extended electrode 15a. This can prevent the extended electrode 15a from being removed together with the first excitation electrode 74a'. Particularly in the present embodiment, the extended electrode 15a is disposed to extend from the vibrating portion 17, which is thick, through the stepped portion 13 to the peripheral portion 18, which is thin. That is, the extended electrode 15a is disposed in an area where disconnection tends to occur. Therefore, performing the second trimming step on an area that does not include the extended electrode 15a is preferable in that it can further improve reliability of electrical connection.

Last, the lid member 20 is joined to the base member 30 (S14). Specifically, the joining member 40 is placed on the sealing frame 37 of the base member 30, so that the sealing frame 37 and the joining member 40 are sandwiched between the counter face 23 of the side wall portion 22 of the lid member 20 and the first principal surface 32a of the base member 30. This produces the quartz crystal resonator unit 1, in which the quartz crystal resonator 10 is accommodated in the internal space 26 defined by the lid member 20 and the base member 30.

In the quartz crystal resonator 10, the first excitation electrode 14a includes the region R1 having the thickness T1 and the region R2 having the thickness T2. The regions R1 and R2 are defined by the opening 62 of the mask 60 used in the second trimming step. For example, as illustrated in FIG. 1, the region R2 extends substantially in the shape of a rectangular frame along the outer edge of the first excitation electrode 14a when viewed in plan from the direction normal to the first principal surface 12a, and the region R1 is an inner region of the first excitation electrode 14a and is surrounded by the region R2.

In the manufacturing method described above, the first and second trimming steps are performed after the quartz crystal resonator 70 is mounted on the base member 30. Therefore, the second excitation electrode 14b facing the base member 30 is not trimmed in either of the first and second trimming steps. Therefore, when the first excitation electrode 74a and the second excitation electrode 14b having the same thickness are disposed on the quartz crystal blank 11, the thickness T3 of the second excitation electrode 14b is larger than both the thicknesses T1 and T2 of the regions R1 and R2 in the first excitation electrode 14a.

As described above, the present embodiment performs the first trimming step on the vibrating portion 17 and the peripheral portions 18 and 19, and also performs the second trimming step on part of the first excitation electrode 74a' disposed on the vibrating portion 17. The first trimming step can clean the quartz crystal resonator 70 while minimizing unnecessary removal of the extended electrode 75a and the like, and the second trimming step can make as much frequency adjustment as needed through partial removal of the first excitation electrode 74a'. It is thus possible to clean the quartz crystal resonator by removing foreign matter therefrom, reduce the amount of variation in excitation frequency caused by adhesion or separation of foreign matter, and prevent or reduce the occurrence of disconnection by reducing the amount of removal processing on the extended electrode.

The present embodiment performs the first and second trimming steps after the quartz crystal resonator is mounted on the base member. It is thus possible to remove foreign matter that has adhered to the quartz crystal resonator during the mounting step, and to further improve the accuracy of frequency adjustment.

The present embodiment can remove foreign matter around a stepped portion at the boundary between the vibrating portion and each peripheral portion. It is thus possible to more effectively improve accuracy in adjusting the excitation frequency.

The present embodiment trims the first excitation electrode adjacent to the lid member 20. This provides a space between the bottom portion 21 of the lid member 20 and the quartz crystal resonator. It is thus possible to provide a quartz crystal resonator unit in which the lid member 20 has a low profile and the occurrence of interference between the quartz crystal resonator and the lid member 20 is reduced.

The present embodiment may be modified. For example, the first trimming step and the second trimming step may use a different dry etching technique, instead of ion milling. For example, plasma chemical vaporization machining (CVM) may be used, instead of ion milling.

Although the first trimming step is followed by the second trimming step in the procedure illustrated in FIG. 3, the order of these trimming steps may be reversed. That is, the second trimming step for frequency adjustment may be followed by the first trimming step for cleaning by removal of foreign matter. This makes it possible to perform frequency adjustment while observing the adhesion of foreign matter, and to accurately detect changes associated with processing in the manufacturing process.

The method described above manufactures the quartz crystal resonator unit 1 including the quartz crystal resonator 10 by performing the first and second trimming steps after mounting the quartz crystal resonator 70 on the base member 30. This manufacturing method may be modified. For example, the quartz crystal resonator 10 may be mounted on the base member 30 after the quartz crystal resonator 10 is manufactured by performing the first and second trimming steps. In this case, unlike the manufacturing method described above, the quartz crystal resonator 10 may be mounted on the base member 30, with the excitation electrode that has been subjected to the first and second trimming steps facing the base member 30. Alternatively, both the first and second excitation electrodes of the quartz crystal resonator may be subjected to the first and second trimming steps.

Unlike the manufacturing method described above, the first trimming step may use a trimming technique different from that used by the second trimming step.

Second Embodiment

Figure 6:
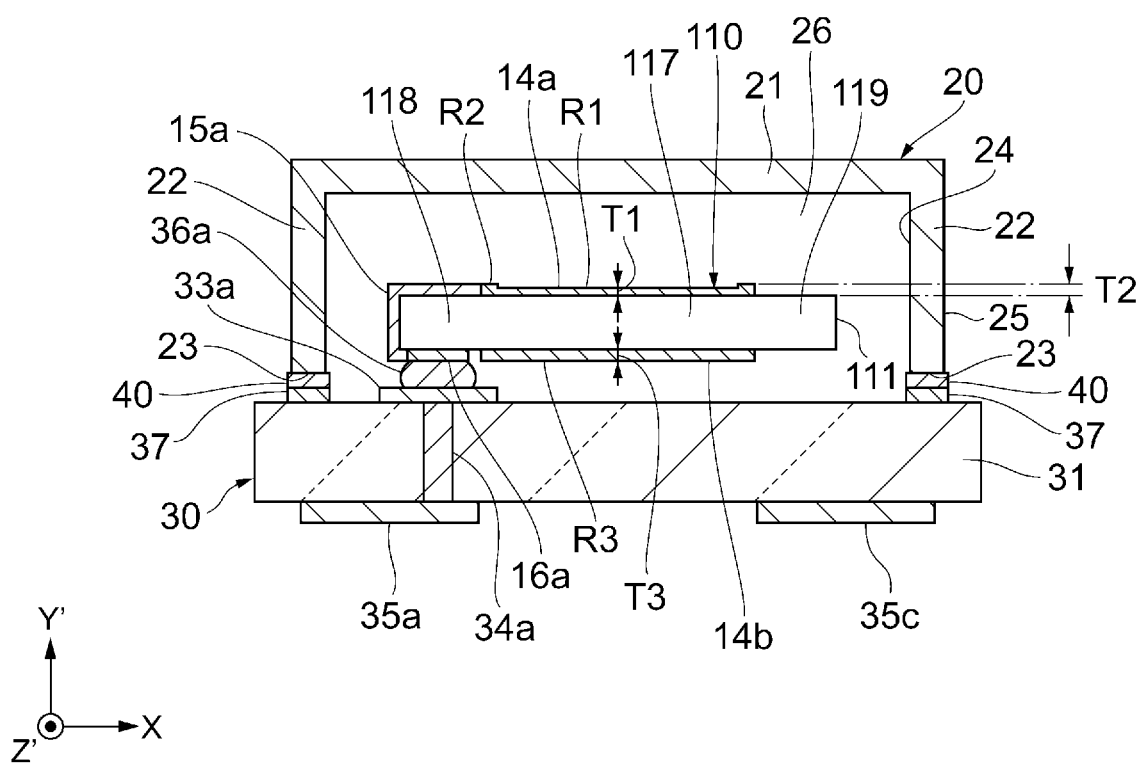
FIG. 6 is a cross-sectional view illustrating a quartz crystal resonator unit according to a second embodiment of the present invention.

A quartz crystal resonator unit according to a second embodiment of the present invention will be described with reference to FIG. 6. FIG. 6 is a cross-sectional view of a quartz crystal resonator unit according to the present embodiment. Note that the same components as those in the first embodiment are denoted by the same reference numerals. Differences from the first embodiment will now be described.

A quartz crystal resonator unit 2 according to the present embodiment includes a quartz crystal resonator 110, which is configured differently from the quartz crystal resonator 10 of the first embodiment. Specifically, as illustrated in FIG. 6, the quartz crystal resonator 110 includes a quartz crystal blank 111 having a substantially flat plate-like shape. The quartz crystal blank 111 has a vibrating portion 117 and peripheral portions 118 and 119 adjacent to the vibrating portion 117. The vibrating portion 117 and the peripheral portions 118 and 119 have the same thickness in the Y'-axis direction.

The present embodiment performs the first trimming step on the vibrating portion 117 and the peripheral portions 118 and 119, and performs the second trimming step on part of one of the excitation electrodes on the vibrating portion 117. This can clean the quartz crystal resonator while minimizing unnecessary removal of the extended electrode and the like, and can make as much frequency adjustment as needed through partial removal of the excitation electrode.

Modifications

The present invention is not limited to the embodiments described above, and can be applied in variously modified forms.

Although the first embodiment describes a mesa structure where the vibrating portion is thicker than the peripheral portions, the present invention may be applied to an inverted mesa structure where the vibrating portion is thinner than the peripheral portions. The present invention may be applied to a substantially convex or beveled shape where the thickness of the quartz crystal blank continuously changes from the vibrating portion toward each peripheral portion.

Although the base member has a substantially flat plate-like shape and the lid member has a substantially tray-like shape in the first embodiment, the shapes of the base member and the lid member are not particularly limited, as long as the quartz crystal resonator can be accommodated in the internal space. For example, the base member may have a substantially tray-like shape and the lid member may have a substantially flat plate-like shape.

The quartz crystal blank may have a cut angle (e.g., BT-cut angle) different from the AT-cut angle.

The embodiments described above are intended to facilitate understanding of the present invention, and are not intended to interpret the present invention in a limiting sense. The present invention can be changed or improved without departing from the scope thereof, and includes equivalents thereof. That is, embodiments to which design changes are appropriately made by those skilled in the art are also included in the scope of the present invention, as long as they have the features of the present invention. For example, the elements of the embodiments and their arrangements, materials, conditions, shapes, and sizes are not limited to the illustrated ones and can be changed appropriately. The elements of the embodiments may be combined as long as it is technically possible, and combinations of the elements are also included in the scope of the present invention, as long as they have the features of the present invention.

What is claimed is:

1. A quartz crystal resonator comprising:
   a quartz crystal blank having a vibrating portion including a center of a principal surface of the quartz crystal blank when viewed in plan from a direction normal to the principal surface and a peripheral portion adjacent to the vibrating portion;
   a pair of excitation electrodes opposing each other with the vibrating portion interposed therebetween;
   a pair of electrode pads on the peripheral portion; and
   a pair of extended electrodes each extending from the vibrating portion to the peripheral portion to electrically connect one of the pair of excitation electrodes to a corresponding one of the pair of electrode pads,
   wherein the pair of excitation electrodes includes a first excitation electrode and a second excitation electrode,
   the first excitation electrode includes a first region having a thickness T1 and a second region having a thickness T2 larger than the thickness T1; and
   the second excitation electrode includes a third region having a thickness T3 larger than the thickness T2.

2. The quartz crystal resonator according to claim 1, wherein the quartz crystal blank has a stepped portion at a boundary between the vibrating portion and the peripheral portion, and the extended electrodes each pass through the stepped portion.

3. A quartz crystal resonator unit comprising:
   the crystal resonator according to claim 1;
   a base member on which the quartz crystal resonator is mounted, with a side of the quartz crystal resonator having the second excitation electrode thereon facing the base member; and
   a lid joined to the base member to seal the quartz crystal resonator therebetween.

4. The quartz crystal resonator unit according to claim 3, wherein the quartz crystal blank has a stepped portion at a boundary between the vibrating portion and the peripheral portion, and the extended electrodes each pass through the stepped portion.

* * * * *